United States Patent
Liao et al.

(10) Patent No.: US 12,027,584 B2
(45) Date of Patent: Jul. 2, 2024

(54) TRANSISTOR STRUCTURE AND MANUFACTURING METHOD THEREOF

(71) Applicant: MACRONIX International Co., Ltd., Hsinchu (TW)

(72) Inventors: Jeng Hwa Liao, Hsinchu (TW); Zong-Jie Ko, Kaohsiung (TW); Hsing-Ju Lin, New Taipei (TW); Jung-Yu Shieh, Hsinchu (TW); Ling-Wuu Yang, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 131 days.

(21) Appl. No.: 17/855,300

(22) Filed: Jun. 30, 2022

(65) Prior Publication Data

US 2023/0326969 A1 Oct. 12, 2023

Related U.S. Application Data

(60) Provisional application No. 63/328,745, filed on Apr. 8, 2022.

(51) Int. Cl.
*H01L 29/08* (2006.01)
*H01L 21/265* (2006.01)
(Continued)

(52) U.S. Cl.
CPC .... *H01L 29/0847* (2013.01); *H01L 21/26506* (2013.01); *H01L 21/26513* (2013.01);
(Continued)

(58) Field of Classification Search
CPC ..... H01L 21/823814; H01L 21/823418; H01L 29/66492; H01L 29/6659; H01L 29/0847;
(Continued)

(56) References Cited

U.S. PATENT DOCUMENTS

| 9,881,841 B2 * | 1/2018 | Zaka | H01L 29/6656 |
| 2006/0006427 A1 * | 1/2006 | Tan | H01L 29/6659 |
| | | | 257/E21.336 |

(Continued)

FOREIGN PATENT DOCUMENTS

EP      1463101      9/2004

OTHER PUBLICATIONS

"Office Action of Taiwan Counterpart Application", issued on Apr. 14, 2023, p. 1-p. 6.

(Continued)

*Primary Examiner* — Sonya McCall-Shepard
(74) *Attorney, Agent, or Firm* — J.C. PATENTS (57) ABSTRACT

A transistor structure including a substrate, a gate structure, first pocket doped regions, second pocket doped regions, and source/drain extension regions, and source/drain regions is provided. The gate structure is located on the substrate. The first pocket doped regions are located in the substrate aside the gate structure. A dopant of the first pocket doped region includes a group IVA element. The second pocket doped regions are located in the substrate aside the gate structure. A depth of the second pocket doped region is greater than a depth of the first pocket doped region. The source/drain extension regions are located in the first pocket doped regions. The source/drain regions are located in the substrate aside the gate structure. The source/drain extension region is located between the source/drain region and the gate structure.

16 Claims, 6 Drawing Sheets

(51) Int. Cl.
  *H01L 21/266*  (2006.01)
  *H01L 29/06*   (2006.01)
  *H01L 29/10*   (2006.01)
  *H01L 29/167*  (2006.01)
  *H01L 29/417*  (2006.01)
  *H01L 29/423*  (2006.01)
  *H01L 29/66*   (2006.01)
  *H01L 29/78*   (2006.01)

(52) U.S. Cl.
  CPC ...... *H01L 21/26586* (2013.01); *H01L 29/167* (2013.01); *H01L 29/66598* (2013.01); *H01L 29/7833* (2013.01); *H01L 21/266* (2013.01)

(58) Field of Classification Search
  CPC ........... H01L 29/7833; H01L 21/26506; H01L 21/823475; H01L 21/823871
  See application file for complete search history.

(56) References Cited

U.S. PATENT DOCUMENTS

| | | |
|---|---|---|
| 2006/0244080 A1 | 11/2006 | Chen et al. |
| 2011/0033998 A1* | 2/2011 | Hatem .............. H01L 21/26513 257/E21.135 |
| 2011/0034013 A1 | 2/2011 | Hatem et al. |

OTHER PUBLICATIONS

"Office Action of Taiwan Counterpart Application", issued on Jun. 20, 2023, p. 1-p. 3.

\* cited by examiner

TRANSISTOR STRUCTURE AND MANUFACTURING METHOD THEREOF

CROSS-REFERENCE TO RELATED APPLICATION

This application claims the priority benefits of U.S. provisional application Ser. No. 63/328,745, filed on Apr. 8, 2022. The entirety of the above-mentioned patent application is hereby incorporated by reference herein.

BACKGROUND

Technical Field

The invention relates to a semiconductor device and a manufacturing method thereof, and particularly relates to a transistor structure and a manufacturing method thereof.

Description of Related Art

With the advancement of the semiconductor technology, the size of transistor device is also shrinking. However, the dopant in the doped region of the transistor device is prone to diffusion due to the thermal process. As a result, the effective channel length of the transistor device will be reduced, and a short channel effect will occur, thereby reducing the electrical performance of the transistor device.

SUMMARY

The invention provides a transistor structure and a manufacturing method thereof, which can effectively suppress the short channel effect.

The invention provides a transistor structure, which includes a substrate, a gate structure, first pocket doped regions, second pocket doped regions, and source/drain extension (SDE) regions, and source/drain regions. The gate structure is located on the substrate. The first pocket doped regions are located in the substrate aside the gate structure. The dopant of the first pocket doped region includes a group IVA element. The second pocket doped regions are located in the substrate aside the gate structure. The depth of the second pocket doped region is greater than the depth of the first pocket doped region. The source/drain extension regions are located in the first pocket doped regions. The source/drain regions are located in the substrate aside the gate structure. The source/drain extension region is located between the source/drain region and the gate structure.

According to an embodiment of the invention, in the transistor structure, the dopant of the first pocket doped region may be carbon (C) or germanium (Ge).

According to an embodiment of the invention, in the transistor structure, the source/drain region may be connected to the source/drain extension region.

According to an embodiment of the invention, the transistor structure may further include first contact doped regions. The first contact doped regions are located in the substrate aside the gate structure. The source/drain region may be located in the first contact doped region. The dopant of the first contact doped region may include a group IVA element.

According to an embodiment of the invention, the transistor structure may further include second contact doped regions. The second contact doped regions are located in the first contact doped regions. The depth of the second contact doped region may be greater than the depth of the source/drain region.

According to an embodiment of the invention, the transistor structure may further include spacers. The spacers are located on the sidewalls of the gate structure. The source/drain extension region may be located under the spacer.

The invention provides another transistor structure, which includes a substrate, a gate structure, source/drain regions, and contact doped regions. The gate structure is located on the substrate. The source/drain regions are located in the substrate aside the gate structure. The contact doped regions are located in the substrate aside to the gate structure. The source/drain region is located in the contact doped region. The dopant of the contact doped region includes a group IVA element.

The invention provides a manufacturing method of a transistor structure, which includes the following steps. A substrate is provided. A gate structure is formed on the substrate. First pocket doped regions are formed in the substrate aside the gate structure. The dopant of the first pocket doped region includes a group IVA element. Second pocket doped regions are formed in the substrate aside the gate structure. The depth of the second pocket doped region is greater than the depth of the first pocket doped region. Source/drain extension regions are formed in the first pocket doped regions. Source/drain regions are formed in the substrate aside the gate structure. The source/drain extension region is located between the source/drain region and the gate structure.

According to an embodiment of the invention, in the manufacturing method of the transistor structure, the method of forming the first pocket doped region may be a cold implant.

According to an embodiment of the invention, in the manufacturing method of the transistor structure, the temperature of the cold implant may be −20° C. to −100° C.

According to an embodiment of the invention, in the manufacturing method of the transistor structure, the implant energy of the cold implant may be 5 kiloelectron volts (keV) to 15 keV.

According to an embodiment of the invention, in the manufacturing method of the transistor structure, the implant dose of the cold implant may be $5 \times 10^{13}$ atoms/cm² to $5 \times 10^{15}$ atoms/cm².

According to an embodiment of the invention, in the manufacturing method of the transistor structure, the tilt angle of the cold implant may be 3 degrees to 15 degrees.

According to an embodiment of the invention, the manufacturing method of the transistor structure may further include the following step. First contact doped regions are formed in the substrate aside the gate structure. The source/drain region is located in the first contact doped region. The dopant of the first contact doped region may include a group IVA element.

According to an embodiment of the invention, in the manufacturing method of the transistor structure, the method of forming the first contact doped region may be a cold implant.

According to an embodiment of the invention, in the manufacturing method of the transistor structure, the temperature of the cold implant may be −20° C. to −100° C.

According to an embodiment of the invention, in the manufacturing method of the transistor structure, the implant energy of the cold implant may be 10 keV to 20 keV.

According to an embodiment of the invention, in the manufacturing method of the transistor structure, the implant dose of the cold implant may be $1\times10^{14}$ atoms/cm$^2$ to $1\times10^{16}$ atoms/cm$^2$.

According to an embodiment of the invention, in the manufacturing method of the transistor structure, the tilt angle of the cold implant may be 0 degrees.

According to an embodiment of the invention, the manufacturing method of the transistor structure may further include the following step. Second contact doped regions are formed in the of first contact doped regions. The depth of the second contact doped region may be greater than the depth of the source/drain region.

Based on the above description, in the transistor structure of some embodiments of the invention, the source/drain extension regions are located in the first pocket doped regions, and the dopant of the first pocket doped region includes a group IVA element. Therefore, the first pocket doped region can suppress the dopant in the source/drain extension region from diffusing, thereby effectively suppressing the short channel effect and the punch through effect and reducing the leakage current. In the transistor structure of some embodiments of the invention, the source/drain region is located in the contact doped region, and the dopant of the contact doped region includes a group IVA element. Therefore, the contact doped region can suppress the dopant in the source/drain region from diffusing, thereby effectively suppressing the short channel effect and the punch through effect and reducing the resistance value. In the manufacturing method of the transistor structure according to some embodiments of the invention, the source/drain extension regions are formed in the first pocket doped regions, and the dopant of the first pocket doped region includes a group IVA element. Therefore, the first pocket doped region can suppress the dopant in the source/drain extension region from diffusing, thereby effectively suppressing the short channel effect and the punch through effect and reducing the leakage current.

In order to make the aforementioned and other objects, features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The embodiments are described in detail below with reference to the accompanying drawings, but the embodiments are not intended to limit the scope of the invention. For the sake of easy understanding, the same components in the following description will be denoted by the same reference symbols. In addition, the drawings are for illustrative purposes only and are not drawn to the original dimensions. In fact, the dimensions of the various features may be arbitrarily increased or reduced for clarity of discussion.

FIG. 1A to FIG. 1F are cross-sectional views illustrating a manufacturing process of a transistor structure according to some embodiments of the invention.

Figure 1A:
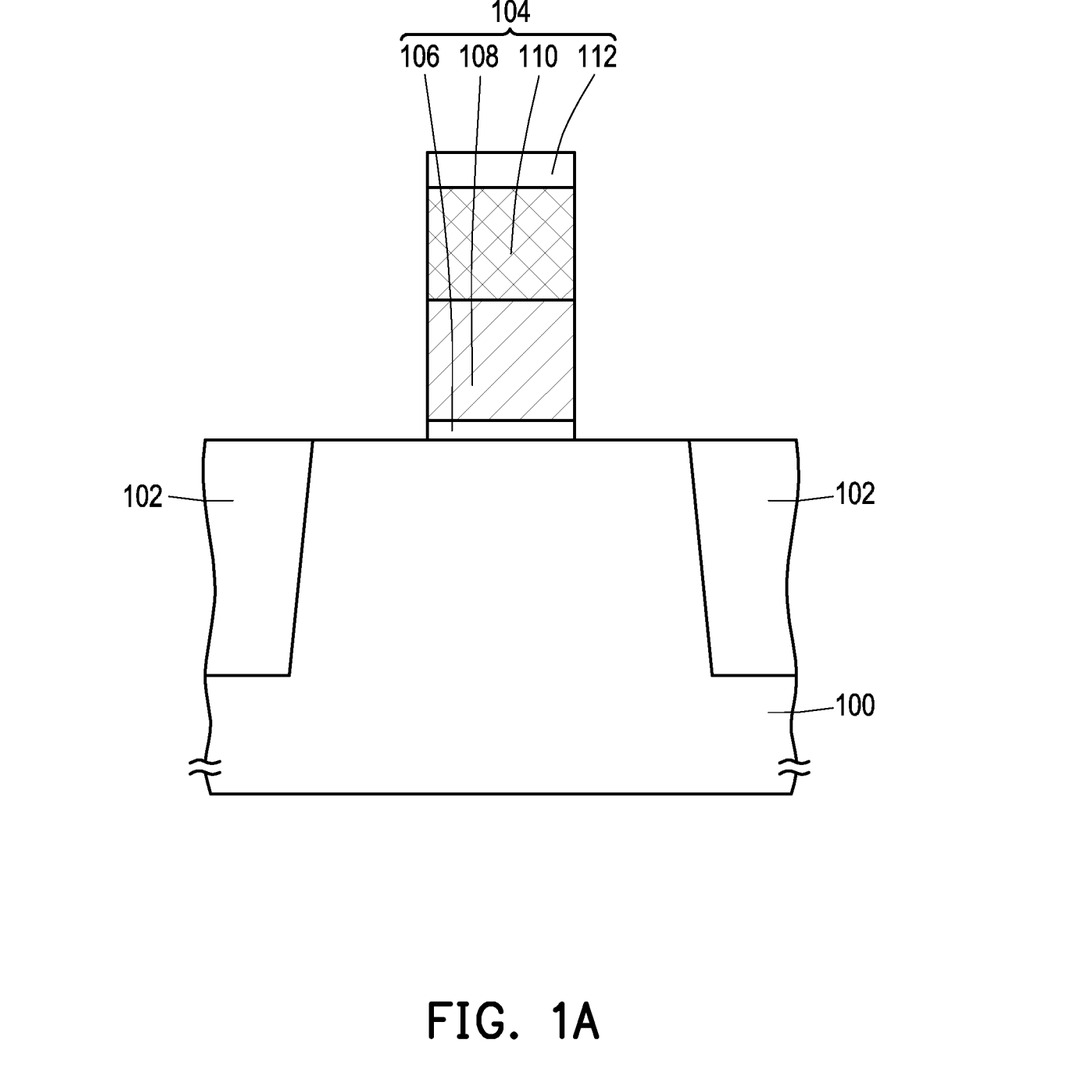
FIG. 1A to FIG. 1F are cross-sectional views illustrating a manufacturing process of a transistor structure according to some embodiments of the invention.

Referring to FIG. 1A, a substrate 100 is provided. The substrate 100 may be a semiconductor substrate such as a silicon substrate. In some embodiments, an isolation structure 102 may be formed in substrate 100. The isolation structure 102 is, for example, a shallow trench isolation (STI) structure. The material of the isolation structure 102 is, for example, silicon oxide.

A gate structure 104 is formed on the substrate 100. The gate structure 104 may include a dielectric layer 106 and a conductive layer 108. The dielectric layer 106 is located on the substrate 100. The dielectric layer 106 can be used as a gate dielectric layer. The material of the dielectric layer 106 is, for example, silicon oxide. The conductive layer 108 is located on the dielectric layer 106. The conductive layer 108 can be used as a gate. The material of the conductive layer 108 is, for example, doped polysilicon. In some embodiments, the gate structure 104 may further include at least one of a metal silicide layer 110 and a hard mask layer 112. The metal silicide layer 110 is located on the conductive layer 108. The material of the metal silicide layer 110 is, for example, tungsten silicide (WSi). The hard mask layer 112 is located on the metal silicide layer 110. The material of the hard mask layer 112 is, for example, silicon oxide.

In some embodiments, the method of forming the dielectric layer 106, the conductive layer 108, the metal silicide layer 110, and the hard mask layer 112 may include the following steps. First, a dielectric material layer (not shown), a conductive material layer (not shown), a metal silicide material layer (not shown), and a hard mask material layer (not shown) may be sequentially formed on the substrate 100. Then, the hard mask material layer, the metal silicide material layer, the conductive material layer, and the dielectric material layer may be patterned by a lithography process and an etching process to form the hard mask layer 112, the metal silicide layer 110, and the conductive layer 108, and the dielectric layer 106.

Figure 1B:
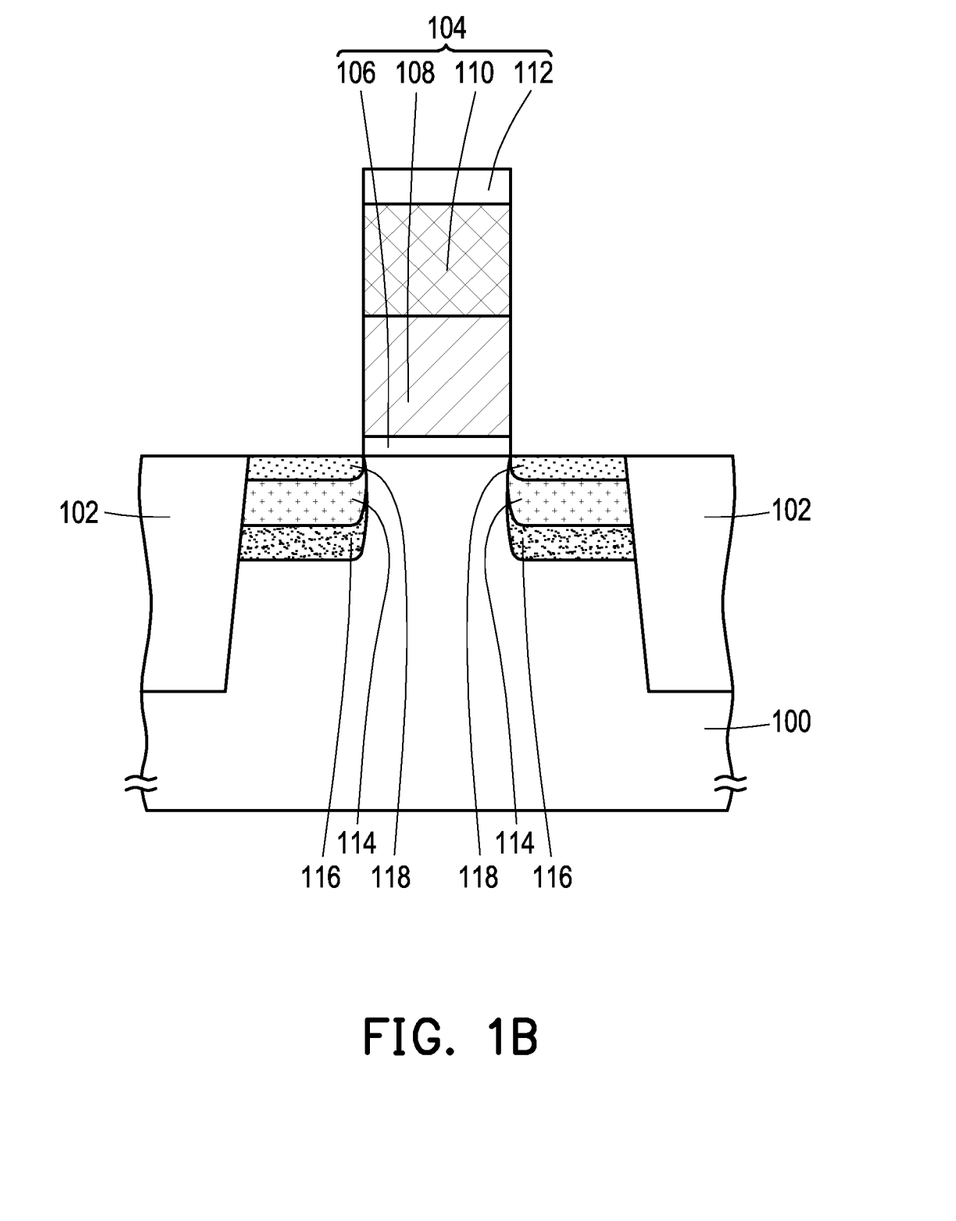

Referring to FIG. 1B, pocket doped regions 114 are formed in the substrate 100 aside the gate structure 104. In some embodiments, the depth of the pocket doped region 114 is, for example, 170 angstroms (Å) to 300 angstroms. The dopant of the pocket doped region 114 includes a group IVA element. The dopant of pocket doped region 114 may include carbon, silicon, germanium, tin, or lead. In some embodiments, the dopant of pocket doped region 114 may be carbon or germanium. In the present embodiment, the dopant of the pocket doped region 114 is, for example, carbon, but the invention is not limited thereto. The method of forming the pocket doped region 114 may be a cold implant. Throughout the description, the term "cold implant" refers to an ion implantation process performed at low temperature. In some embodiments, the temperature of the cold implant used to form the pocket doped region 114 may be −20° C. to −100° C. In some embodiments, the implant energy of the cold implant used to form the pocket doped region 114 may be 5 keV to 15 keV. In some embodiments, the implant dose of the cold implant used to form the pocket doped region 114 may be $5\times10^{13}$ atoms/cm$^2$ to $5\times10^{15}$ atoms/cm$^2$. In some embodiments, the tilt angle of the cold implant used to form the pocket doped region 114 may be 3 degrees to 15 degrees. In some embodiments, when the dopant of the pocket doped region 114 is carbon, the gas source of the cold implant may be carbon dioxide gas ($CO_2$ gas).

Pocket doped regions 116 are formed in the substrate 100 aside the gate structure 104. The depth of the pocket doped region 116 is greater than the depth of the pocket doped region 114. The pocket doped region 116 may have a first conductivity type (e.g., N-type conductivity type). Hereinafter, the first conductivity type and the second conductivity type may be one and the other of an N-type conductivity type and a P-type conductivity type, respectively. In the present embodiment, the first conductivity type is, for example, an N-type conductivity type, and the second conductivity type is, for example, a P-type conductivity type, but the invention is not limited thereto. In other embodiments, the first conductivity type may be a P-type conductivity type, and the second conductivity type may be an N-type conductivity type. In the present embodiment, the pocket doped region 116 may have the N-type conductivity type, and the dopant of the pocket doped region 116 is, for example, arsenic (As). The method of forming the pocket doped region 116 is, for example, an ion implantation method.

Source/drain extension regions 118 are formed in the pocket doped regions 114. In some embodiments, the source/drain extension region may be referred to as "lightly doped drain (LDD) region. The source/drain extension region 118 may have the second conductivity type (e.g., P-type conductivity type). In the present embodiment, the source/drain extension region 118 may have the P-type conductivity type, and the dopant of the source/drain extension region 118 is, for example, boron (B) or boron difluoride ($BF_2$). The method of forming the source/drain extension region 118 is, for example, an ion implantation method.

Figure 1C:
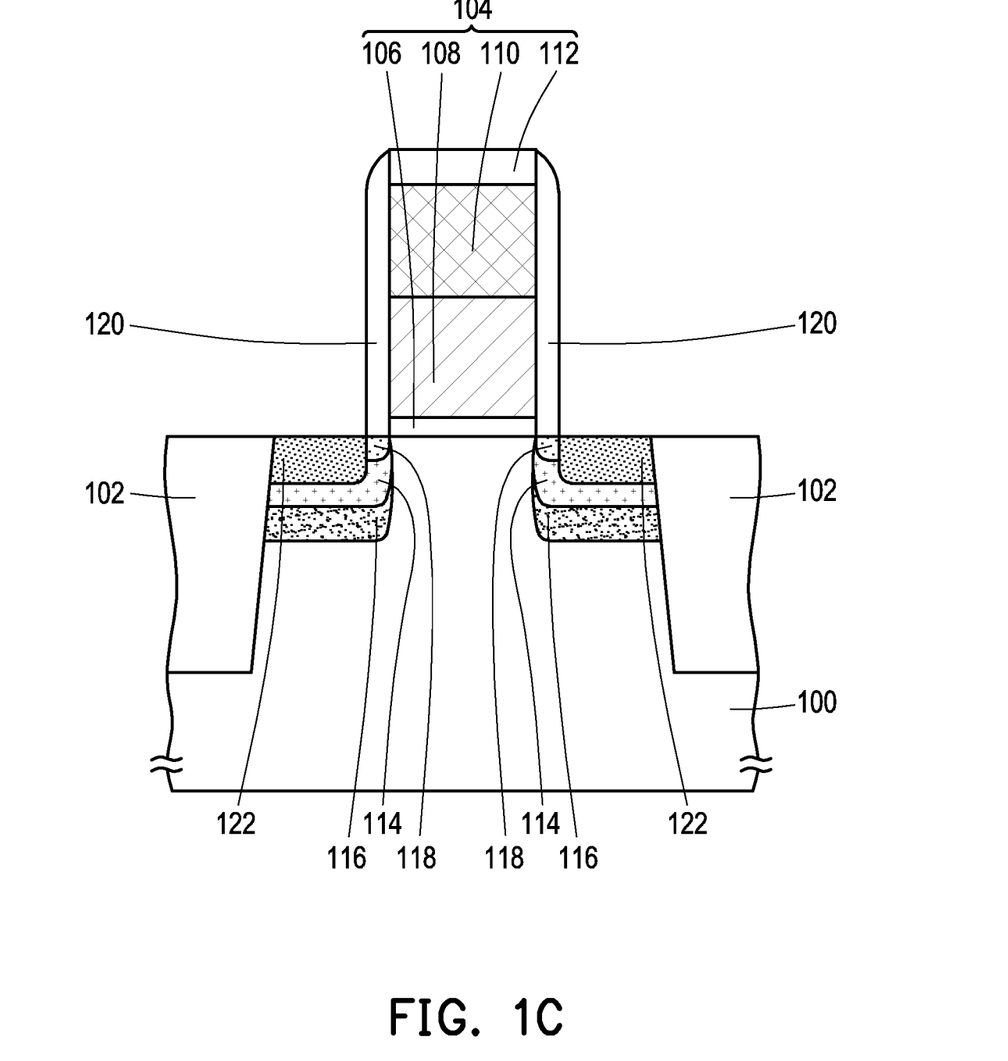

Referring to FIG. 1C, spacers 120 may be formed on the sidewalls of the gate structure 104. The spacer 120 may be a single-layer structure or a multilayer structure. The material of the spacer 120 is, for example, silicon oxide, silicon nitride, or a combination thereof. In some embodiments, the method of forming the spacer 120 may include the following steps. First, a spacer material layer (not shown) may be conformally formed on the substrate 100, the isolation structure 102, and the gate structure 104. Then, an etch-back process (e.g., dry etching process) is performed on the spacer material layer to form the spacer 120.

Source/drain regions 122 are formed in the substrate 100 aside the gate structure 104. The source/drain extension region 118 is located between the source/drain region 122 and the gate structure 104. The source/drain region 122 may be connected to the source/drain extension region 118. The depth of the source/drain region 122 may be greater than the depth of source/drain extension region 118. The source/drain region 122 may have the second conductivity type (e.g., P-type conductivity type). In the present embodiment, the source/drain region 122 may have the P-type conductivity type, and the dopant of the source/drain region 122 is, for example, boron (B) or boron difluoride ($BF_2$). The method of forming the source/drain region 122 is, for example, an ion implantation method.

Figure 1D:
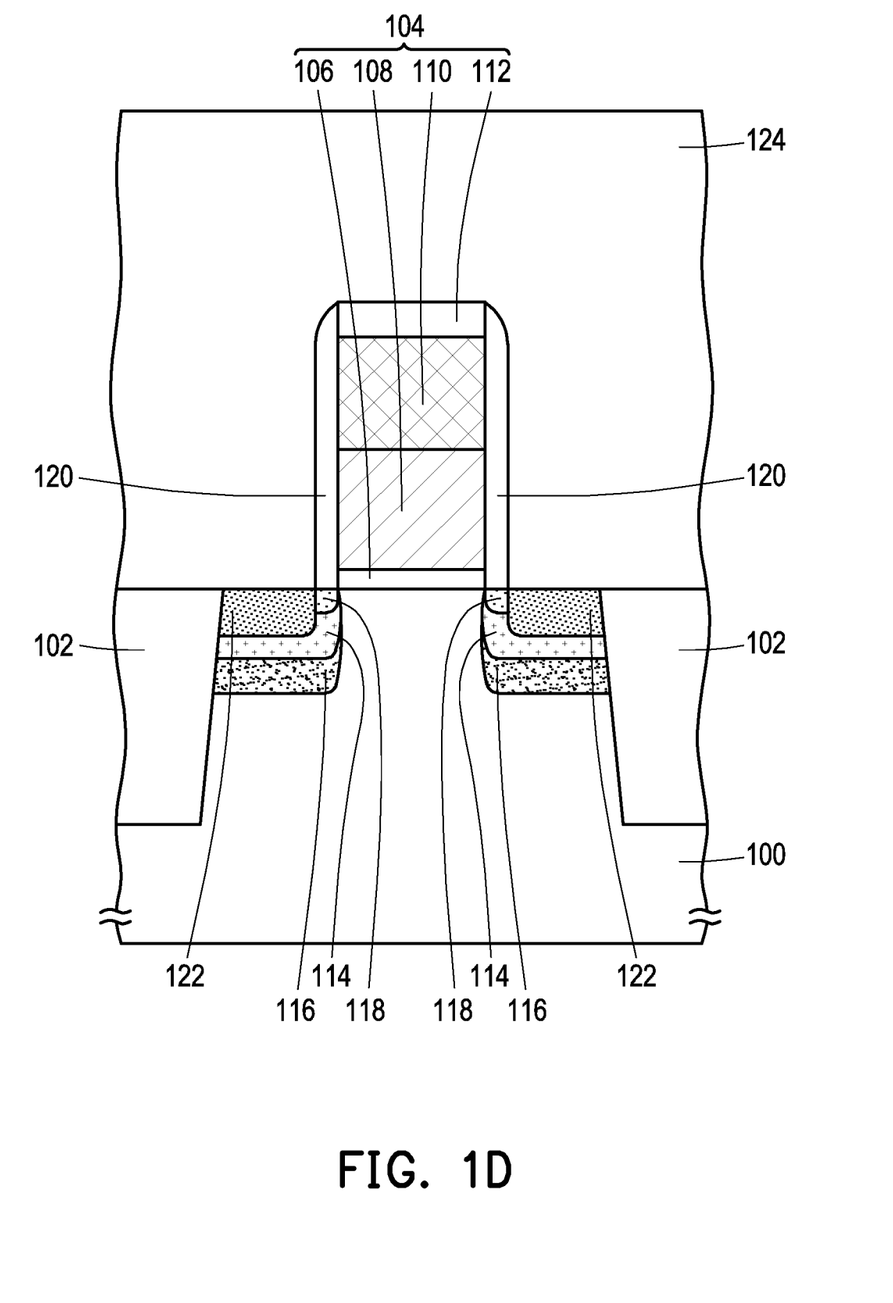

Referring to FIG. 1D, a dielectric layer 124 may be formed on the substrate 100, the isolation structure 102, the gate structure 104, and the spacer 120. The dielectric layer 124 may be a single-layer structure or a multilayer structure. The material of the dielectric layer 124 is, for example, silicon oxide, silicon nitride, or a combination thereof. The method of forming the dielectric layer 124 is, for example, a chemical vapor deposition method.

Figure 1E:
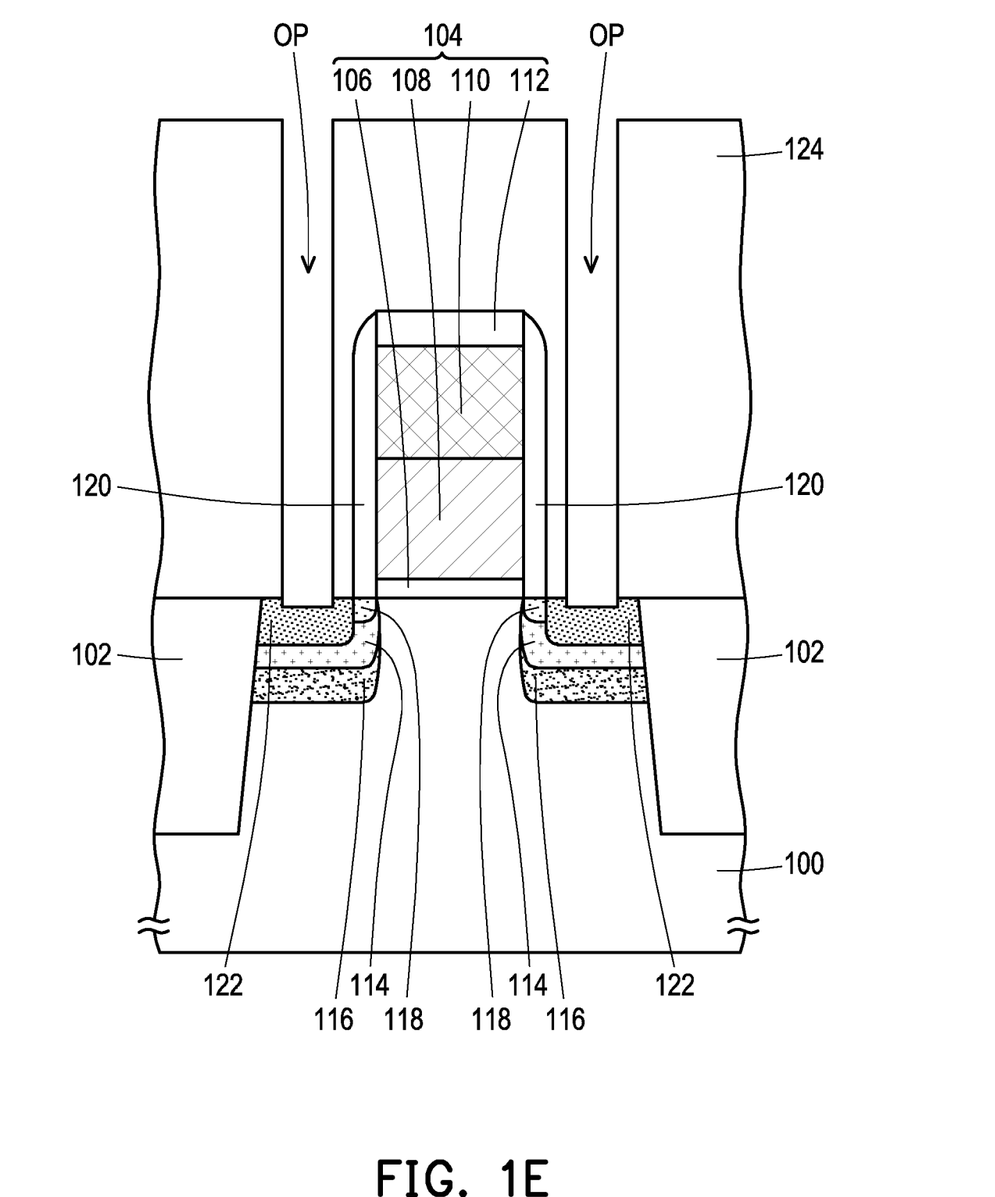

Referring to FIG. 1E, openings OP may be formed in the dielectric layer 124. The opening OP may expose the source/drain region 122. In some embodiments, the opening OP may be formed by removing a portion of the dielectric layer 124 by a lithography process and an etching process. In some embodiments, during the process of forming the opening OP, a portion of the source/drain region 122 may be removed.

Figure 1F:
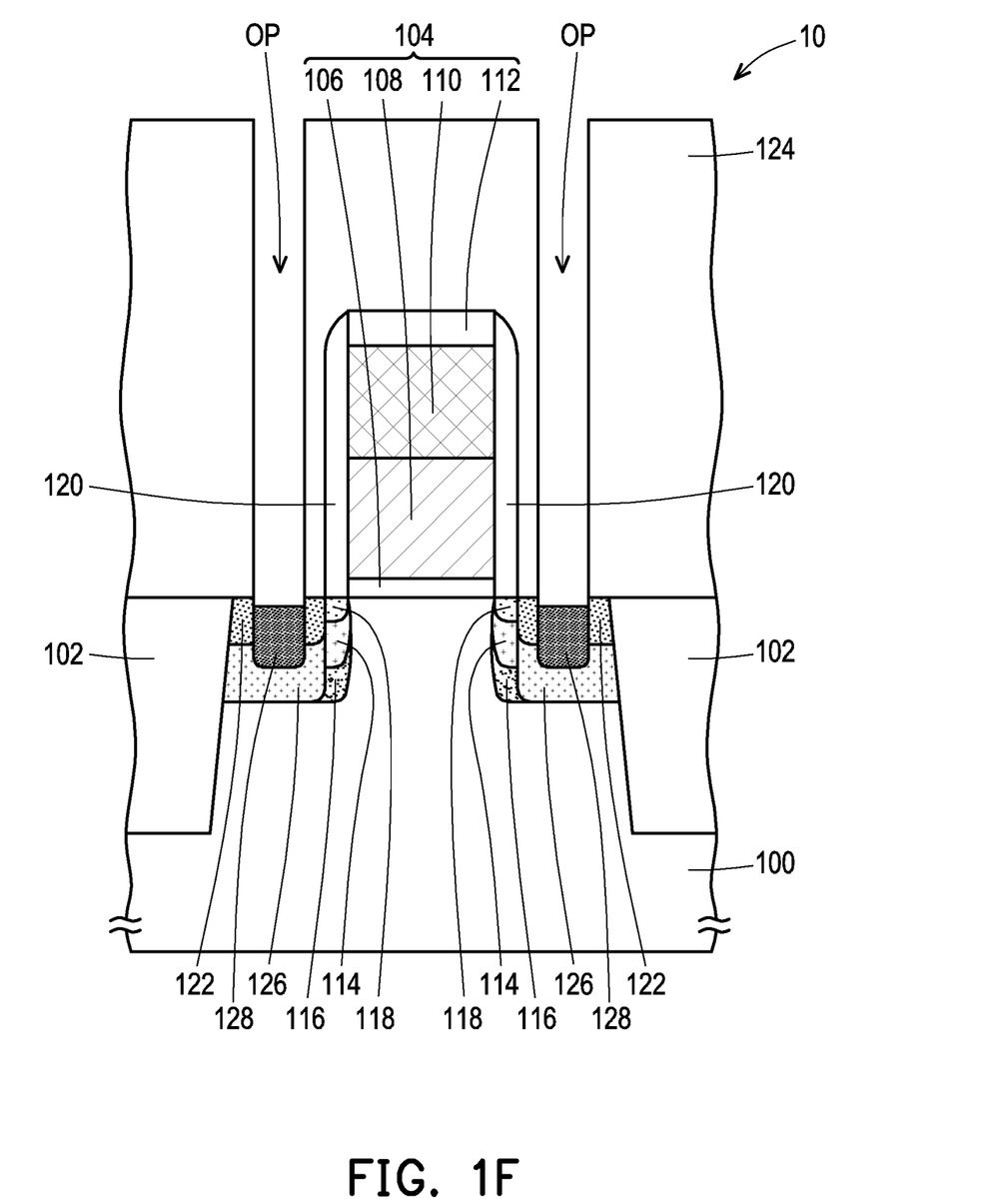

Referring to FIG. 1F, contact doped regions 126 may be formed in the substrate 100 aside the gate structure 104. The source/drain region 122 is located in the contact doped region 126. In some embodiments, the depth of the contact doped region 126 is, for example, 250 angstroms to 400 angstroms. The dopant of the contact doped region 126 may include a group IVA element. The dopant of the contact doped region 126 may include carbon, silicon, germanium, tin, or lead. In some embodiments, the dopant of the contact doped region 126 may be carbon or germanium. In the present embodiment, the dopant of the contact doped region 126 is, for example, carbon, but the invention is not limited thereto. The method of forming the contact doped region 126 may be a cold implant. In some embodiments, the temperature of the cold implant used to form the contact doped region 126 may be −20° C. to −100° C. In some embodiments, the implant energy of the cold implant used to form the contact doped region 126 may be 10 keV to 20 keV. In some embodiments, the implant dose of the cold implant used to form the contact doped region 126 may be $1 \times 10^{14}$ atoms/cm$^2$ to $1 \times 10^{16}$ atoms/cm$^2$. In some embodiments, the tilt angle of the cold implant used to form the contact doped region 126 may be 0 degrees. In some embodiments, when the dopant of the contact doped region 126 is carbon, the gas source of the cold implant may be carbon dioxide gas.

Contact doped regions 128 may be formed in the contact doped regions 126. The depth of the contact doped region 128 may be greater than the depth of the source/drain region 122. In some embodiments, the depth of the contact doped region 128 is, for example, 100 angstroms to 200 angstroms. The contact doped region 128 may have the second conductivity type (e.g., P-type conductivity type). In the present embodiment, the contact doped region 128 may have the P-type conductivity type, and the dopant of the contact doped region 128 is, for example, boron (B) or boron difluoride ($BF_2$). The method of forming the contact doped region 128 is, for example, an ion implantation method.

Based on the above, in the manufacturing method of the transistor structure 10 of some embodiments, the source/drain extension regions 118 are formed in the pocket doped regions 114, and the dopant of the pocket doped region 114 includes a group IVA element. Therefore, the pocket doped region 114 can suppress the dopant in the source/drain extension region 118 from diffusing, thereby effectively suppressing the short channel effect and the punch through effect and reducing the leakage current. In addition, in the manufacturing method of the transistor structure 10 of some embodiments, the contact doped regions 126 are formed in the substrate 100 aside the gate structure 104, the source/drain region 122 is located in the contact doped region 126, and the dopant of the contact doped region 126 may include a group IVA element. Therefore, the contact doped region 126 can suppress the dopant in the source/drain region 122 from diffusing, thereby effectively suppressing the short channel effect and the punch through effect and reducing the resistance value. In some embodiments, the manufacturing method of the transistor structure 10 may further include forming the contact doped regions 128 in the contact doped regions 126. Since the contact doped region 126 can suppress the dopant in the contact doped region 128 from diffusing, the short channel effect and the punch through effect can be effectively suppressed, and the resistance value can be reduced.

Hereinafter, the transistor structure 10 of the above embodiment is described with reference to FIG. 1F. In addition, although the method for forming the transistor structure 10 is described by taking the above method as an example, the invention is not limited thereto.

Referring to FIG. 1F, the transistor structure 10 includes a substrate 100, a gate structure 104, pocket doped regions 114, pocket doped regions 116, source/drain extension regions 118, and source/drain regions 122. The transistor structure 10 may be a P-type metal oxide semiconductor (PMOS) transistor structure or an N-type metal oxide semiconductor (NMOS) transistor structure. In the present embodiment, the transistor structure 10 is, for example, a PMOS transistor structure, but the invention is not limited thereto. The gate structure 104 is located on substrate 100. The pocket doped regions 114 are located in the substrate 100 aside the gate structure 104. The dopant of the pocket doped region 114 includes a group IVA element. The pocket doped regions 116 are located in the substrate 100 aside the gate structure 104. The depth of the pocket doped region 116 is greater than the depth of the pocket doped region 114. The source/drain extension regions 118 are located in pocket doped regions 114. The source/drain regions 122 are located in the substrate 100 aside the gate structure 104. The source/drain extension region 118 is located between the source/drain region 122 and the gate structure 104.

In some embodiments, the transistor structure 10 may further include contact doped regions 126. The contact doped regions 126 are located in the substrate 100 aside the gate structure 104. The source/drain region 122 may be located in the contact doped region 126.

The dopant of the contact doped region 126 may include a group IVA element. In some embodiments, the transistor structure 10 may further include contact doped regions 128. The contact doped regions 128 are located in the contact doped regions 126. The depth of the contact doped regions 128 may be greater than the depth of the source/drain regions 122. In some embodiments, the transistor structure 10 may further include spacers 120. The spacers 120 are located on the sidewalls of the gate structure 104. The source/drain extension region 118 may be located under the spacer 120.

In the above embodiment, although the transistor structure 10 includes both the pocket doped region 114 and the contact doped region 126, the invention is not limited thereto. In other embodiments, the transistor structure 10 includes the pocket doped region 114 but does not include the contact doped region 126. In other embodiments, the transistor structure includes the contact doped region 126 but does not include the pocket doped region 114.

In some embodiments, the transistor structure 10 may be applied to a complementary metal oxide semiconductor (CMOS) under array (CuA) architecture or a CMOS near array (CnA) architecture.

Furthermore, the remaining components in the transistor structure 10 may refer to the description of the above embodiments. Moreover, the details (e.g., the material and the forming method) of the components in the transistor structure 10 have been described in detail in the above embodiments, and the description thereof is not repeated here.

Based on the above, in the transistor structure 10 of some embodiments, the source/drain extension regions 118 are located in the pocket doped regions 114, and the dopant of the pocket doped region 114 includes a group IVA element. Therefore, the pocket doped region 114 can suppress the dopant in the source/drain extension region 118 from diffusing, thereby effectively suppressing the short channel effect and the punch through effect and reducing the leakage current. In the transistor structure 10 of some embodiments, the source/drain region 122 is located in the contact doped region 126, and the dopant of the contact doped region 126 includes a group IVA element. Therefore, the contact doped region 126 can suppress the dopant in the source/drain region 122 from diffusing, thereby effectively suppressing the short channel effect and the punch through effect and reducing the resistance value. In some embodiments, the transistor structure 10 may further include the contact doped regions 128, and the contact doped regions 128 are located in the contact doped regions 126. Since the contact doped region 126 can suppress the dopant in the contact doped region 128 from diffusing, the short channel effect and the punch through effect can be effectively suppressed, and the resistance value can be reduced.

In summary, in the transistor structure and the manufacturing method thereof of the aforementioned embodiments, the doped region including a group IVA element can suppress the dopant in the source/drain extension region and/or the source/drain region from diffusing, so the short channel effect can be effectively suppressed.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A transistor structure, comprising:
   a substrate;
   a gate structure located on the substrate;
   first pocket doped regions located in the substrate aside the gate structure, wherein a dopant of the first pocket doped regions comprises a group IVA element;
   second pocket doped regions located in the substrate aside the gate structure, wherein a depth of the second pocket doped regions is greater than a depth of the first pocket doped regions;
   source/drain extension regions located in the first pocket doped regions;
   source/drain regions located in the substrate aside the gate structure, wherein the source/drain extension regions are located between the source/drain regions and the gate structure;
   first contact doped regions located in the substrate aside the gate structure, wherein the source/drain regions are located in the first contact doped regions, and a dopant of the first contact doped regions comprises the group IVA element; and
   second contact doped regions located in the first contact doped regions, wherein a depth of the second contact doped regions is greater than a depth of the source/drain regions, wherein
   the first contact doped regions and the second contact doped regions are not located directly below the gate structure.

2. The transistor structure according to claim 1, wherein the dopant of the first pocket doped regions comprises carbon or germanium.

3. The transistor structure according to claim 1, wherein the source/drain regions are connected to the source/drain extension regions.

4. The transistor structure according to claim 1, further comprising:
spacers located on sidewalls of the gate structure, wherein the source/drain extension regions are located under the spacers.

5. A transistor structure, comprising:
a substrate;
a gate structure located on the substrate;
source/drain regions located in the substrate aside the gate structure;
first contact doped regions located in the substrate aside the gate structure, wherein the source/drain regions are located in the first contact doped regions, and a dopant of the first contact doped regions comprises a group IVA element; and
second contact doped regions located in the first contact doped regions, wherein a depth of the second contact doped regions is greater than a depth of the source/drain regions, wherein
the first contact doped regions and the second contact doped regions are not located directly below the gate structure.

6. A manufacturing method of a transistor structure, comprising:
providing a substrate;
forming a gate structure on the substrate;
forming first pocket doped regions in the substrate aside the gate structure, wherein a dopant of the first pocket doped regions comprises a group IVA element;
forming second pocket doped regions in the substrate aside the gate structure, wherein a depth of the second pocket doped regions is greater than a depth of the first pocket doped regions;
forming source/drain extension regions in the first pocket doped regions;
forming source/drain regions in the substrate aside the gate structure, wherein the source/drain extension regions are located between the source/drain regions and the gate structure;
forming first contact doped regions in the substrate aside the gate structure, wherein the source/drain regions are located in the first contact doped regions, and a dopant of the first contact doped regions comprises the group IVA element; and
forming second contact doped regions in the first contact doped regions, wherein a depth of the second contact doped regions is greater than a depth of the source/drain regions, wherein
the first contact doped regions and the second contact doped regions are not located directly below the gate structure.

7. The manufacturing method of the transistor structure according to claim 6, wherein a method of forming the first pocket doped regions comprises a cold implant.

8. The manufacturing method of the transistor structure according to claim 7, wherein a temperature of the cold implant is −20° C. to −100° C.

9. The manufacturing method of the transistor structure according to claim 7, wherein an implant energy of the cold implant is 5 keV to 15 keV.

10. The manufacturing method of the transistor structure according to claim 7, wherein an implant dose of the cold implant is $5\times10^{13}$ atoms/cm$^2$ to $5\times10^{15}$ atoms/cm$^2$.

11. The manufacturing method of the transistor structure according to claim 7, wherein a tilt angle of the cold implant is 3 degrees to 15 degrees.

12. The manufacturing method of the transistor structure according to claim 6, wherein a method of forming the first contact doped regions comprises a cold implant.

13. The manufacturing method of the transistor structure according to claim 12, wherein a temperature of the cold implant is −20° C. to −100° C.

14. The manufacturing method of the transistor structure according to claim 12, wherein an implant energy of the cold implant is 10 keV to 20 keV.

15. The manufacturing method of the transistor structure according to claim 12, wherein an implant dose of the cold implant is $1\times10^{14}$ atoms/cm$^2$ to $1\times10^{16}$ atoms/cm$^2$.

16. The manufacturing method of the transistor structure according to claim 12, wherein a tilt angle of the cold implant is 0 degrees.

* * * * *